United States Patent
Bryce et al.

(10) Patent No.: US 8,492,273 B2
(45) Date of Patent: Jul. 23, 2013

(54) METHOD FOR SELECTIVE DEPOSITION OF A SEMICONDUCTOR MATERIAL

(75) Inventors: George Bryce, Leuven (BE); Simone Severi, Leuven (BE); Peter Verheyen, Nijlen (BE)

(73) Assignee: IMEC, Leuven (BE)

(*) Notice: Subject to any disclaimer, the term of this patent is extended or adjusted under 35 U.S.C. 154(b) by 0 days.

(21) Appl. No.: 13/195,262

(22) Filed: Aug. 1, 2011

(65) Prior Publication Data

US 2012/0034762 A1    Feb. 9, 2012

(30) Foreign Application Priority Data

Aug. 6, 2010   (EP) .................................. 10172129

(51) Int. Cl.
*H01L 21/4763* (2006.01)

(52) U.S. Cl.
USPC ............ 438/641; 257/E21.131; 257/E21.132; 257/E21.171; 257/E21.562; 257/E21.571; 438/256; 438/399; 438/478

(58) Field of Classification Search
USPC ................... 257/E21.131, E21.132, E21.171, 257/E21.562, E21.571; 438/256, 399, 478, 438/641

See application file for complete search history.

(56) References Cited

U.S. PATENT DOCUMENTS

| | | | |
|---|---|---|---|
| 5,431,964 A | 7/1995 | Rivoire | |
| 5,504,026 A * | 4/1996 | Kung | 438/50 |
| 5,864,161 A * | 1/1999 | Mitani et al. | 257/347 |
| 2003/0005881 A1 | 1/2003 | Shin | |
| 2003/0045092 A1 | 3/2003 | Shin | |
| 2003/0087512 A1 | 5/2003 | Cheong | |
| 2003/0186533 A1 | 10/2003 | Cheong | |
| 2004/0152321 A1 | 8/2004 | Gehrke et al. | |
| 2006/0237766 A1 | 10/2006 | Ahn | |
| 2008/0153266 A1 | 6/2008 | Leys et al. | |

OTHER PUBLICATIONS

European Search Report, European Patent Application No. 10172129.8 dated Mar. 18, 2011.

* cited by examiner

*Primary Examiner* — Asok K Sarkar
(74) *Attorney, Agent, or Firm* — McDonnell Boehnen Hulbert & Berghoff LLP

(57) ABSTRACT

A method is disclosed comprising providing a substrate comprising an insulating material and a second semiconductor material and pre-treating the substrate with a plasma produced from a gas selected from the group consisting of a carbon-containing gas, a halogen-containing gas, and a carbon-and-halogen containing gas. The method further comprises depositing a first semiconductor material on the pre-treated substrate by chemical vapor deposition, where the first semiconductor material is selectively deposited on the second semiconductor material. The method may be used to manufacture a semiconducting device, such as a microelectromechanical system device, or to manufacture a semiconducting device feature, such as an interconnect.

23 Claims, 6 Drawing Sheets

METHOD FOR SELECTIVE DEPOSITION OF A SEMICONDUCTOR MATERIAL

CROSS-REFERENCE TO RELATED APPLICATION

This application claims priority to European Patent Application Serial No. 10172129.8 filed Aug. 6, 2010.

BACKGROUND

The present invention is related to the field of semiconductor processing. More specifically, the present invention is directed to selective deposition of a semiconductor material onto a mixed substrate.

Nowadays, the drive towards heterogeneous integration poses the problem of interconnecting different functional modules (such as e.g. digital complementary metal-oxide-semiconductor (CMOS), analog CMOS, Micro Electro Mechanical Systems (MEMS), and optics) on the same silicon chip. The resulting increase in interconnections requires simplification or adaptation of the existing materials and/or the processing techniques in order to lower the cost, reduce process manufacturing time, and maximize the yield. Additionally, several functional modules (such as, e.g., analog CMOS or MEMS) may require deep trenches or trenches with a high aspect ratio that are typically formed by expensive lithography techniques or plasma etch processing.

The conventional via formation process at interconnect level requires chemical mechanical planarization (CMP) for surface planarization. The latter is known to have numerous limitations such as relatively high costs and defect addition. This in turn reduces the process yield, as determined by the percentage of fully functional dice on a silicon wafer.

In this context, finding alternative processing methods which do not require using CMP has therefore emerged as a valid option.

U.S. Pat. No. 5,431,964 discloses a method of pre-treating a deposition chamber intended to be used for the selective vapor deposition of tungsten, which may allegedly be used in the manufacture of integrated circuits and in particular for the formation of metal interlayer connections.

Despite the progress in the art, there is still a need for an efficient method for the selective deposition of semiconductor material onto a mixed substrate comprising a semiconductor material and an insulator material.

Advantageously, the method of the present invention allows forming narrow trenches or performing trench narrowing, without requiring costly photolithography processing or high aspect ratio etching techniques. In another aspect, the method of the invention may be used for performing gap filling of contacts or vias without requiring CMP techniques.

Other advantages of the invention will be immediately apparent to those skilled in the art from the following description.

SUMMARY

According to one aspect of the present invention, it is provided a method for the (selective) deposition of a first semiconductor material on a substrate comprising a second semiconductor material and an insulator material, whereby the first semiconductor material is selectively deposited on the second semiconductor material, and wherein the method comprises the steps of:
 a) pre-treating the substrate with a plasma produced from a carbon- and/or halogen-containing gas; and
 b) depositing the first semiconductor material on the pre-treated substrate by chemical vapor deposition.

In some embodiments of the method described above, the substrate is provided with a trench or a via formed in a layer comprising the insulator material, wherein the second semiconductor material is at least partially exposed at the bottom of the trench or a via, and whereby the trench or via is (at least partially) filled with the first semiconductor material.

Alternatively, in the method of the invention as described above, the substrate is provided with a trench or a via formed in a layer comprising the second semiconductor material, wherein the insulator material is (at least partially) exposed at the bottom of the trench or a via, and whereby the trench or via is (at least partially) narrowed with the first semiconductor material.

According to another aspect, the present invention is also directed to a method of forming a semiconducting device feature, wherein the method comprises the steps of:
 a) providing a substrate comprising a second semiconductor material and an insulator material, wherein the substrate is provided with a trench or a via formed in a layer comprising the insulator material and wherein the second semiconducting material is (at least partially) exposed at the bottom of the trench or via;
 b) pre-treating the substrate with a plasma produced from a carbon- and/or halogen-containing gas; and
 c) depositing a first semiconductor material into the trench or via, thereby filling (at least partially) the trench or via.

According to still another aspect, the present invention is also directed to a method of forming a semiconducting device feature, wherein the method comprises the steps of:
 a) providing a substrate comprising a second semiconductor material and an insulating material, wherein the substrate is provided with a trench or a via formed in a layer comprising the second semiconductor material, and wherein the insulating material is (at least partially) exposed at the bottom of the trench or the via;
 b) pre-treating the substrate with a plasma produced from a carbon- and/or halogen-containing gas; and
 d) depositing a first semiconductor material onto the layer comprising the second semiconductor material, preferably onto the sidewalls of the trench or via, thereby narrowing (at least partially) the trench or via.

In some embodiments of the method described above, the semiconducting device feature is an interconnection.

In some embodiments of the method described above, the step of depositing the first semiconductor material on the pre-treated substrate is performed immediately after the step of pre-treating the substrate with a plasma produced from a carbon- and/or halogen-containing gas.

In some embodiments of the method described above, the step of pre-treating the substrate is performed with a plasma produced from a carbon- and halogen-containing gas. In other embodiments of the method described above, the step of pre-treating the substrate is performed with a plasma produced from a halogen-containing gas. In still other embodiments of the method as described above, the step of pre-treating the substrate is performed with a plasma produced from a carbon-containing gas.

In some embodiments of the method described above, the step of pre-treating the substrate is performed with a plasma produced from a carbon- and/or fluorine-containing gas; even more preferably the plasma is produced from a carbon- and fluorine-containing gas.

In some embodiments of the method described above, the step of pre-treating the substrate with a plasma produced from a carbon- and/or halogen-containing gas, and the step of depositing the first semiconductor material on the pre-treated substrate by chemical vapor deposition, are reiterated one or more times, such as any of 2, 3, 4, 5, 6, 7, 8, 9 or 10 times.

In some embodiments of the method described above, the step of pre-treating the substrate with a plasma produced from a carbon- and/or halogen-containing gas is performed in a plasma deposition chamber, preferably (in-situ) in the same plasma deposition chamber as that used subsequently for depositing the first semiconductor material on the pre-treated substrate by chemical vapor deposition (CVD).

In some embodiments of the method described above, the step of pre-treating the substrate with a plasma produced from a carbon- and/or halogen-containing gas is performed in a PECVD chamber. Alternatively, the step of pre-treating the substrate with a plasma produced from a carbon- and/or halogen-containing gas is performed in a RF plasma etch chamber.

In some embodiments of the method described above, the duration of the step consisting of pre-treating the substrate with a plasma produced from a carbon- and/or halogen-containing gas is comprised between (about) 0.5 second and (about) 300 seconds, preferably between (about) 1 second and (about) 200 seconds, more preferably between (about) 2 seconds and (about) 100 seconds, even more preferably between (about) 3 seconds and (about) 50 seconds, most preferably between (about) 4 seconds and (about) 30 seconds.

In some embodiments of the method described above, the step of pre-treating the substrate with a plasma produced from a carbon- and/or halogen-containing gas is performed by supplying a carbon- and/or halogen-containing gas flow comprised between (about) 10 sccm and (about) 2000 sccm, preferably between (about) 50 sccm and (about) 1000 sccm, more preferably between (about) 100 sccm and (about) 600 sccm, even more preferably between (about) 150 sccm and (about) 300 sccm, most preferably between (about) 150 sccm and (about) 250 sccm.

In some embodiments of the method described above, the first semiconductor material is selected from the group consisting of silicon, germanium, silicon germanium (SiGe), silicon carbide and any combinations thereof. For instance, the first semiconductor material may comprise SiGe. In some embodiments, the first semiconductor material may consist of SiGe.

In some embodiments of the method described above, the insulator material is selected from the group consisting of silicon oxide, silicon nitride and any combinations thereof. For instance, the insulator material may comprise or may consist of silicon oxide.

In some embodiments of the method described above, the carbon- and/or halogen-containing gas is selected from the group consisting of $CF_4$, $C_2F_6$, $NF_3$, $COF_2$, $SiF_4$, $SF_6$, $Cl_2$, HCl, HBr, CO, $CH_4$, $CHF_3$, $CHCl_3$, $CFCl_3$, $CF_3Cl$, $CF_3Br$ and any combinations or mixtures thereof.

In some embodiments of the method described above, the carbon- and/or halogen-containing gas is selected from the group consisting of $CF_4$, $C_2F_6$, $COF_2$, $CHF_3$ and any combinations or mixtures thereof. For instance, the carbon- and/or halogen-containing gas may comprise or may consist of $CF_4$.

In some embodiments of the method described above, the halogen-containing gas is selected from the group consisting of $NF_3$, $SiF_4$, $SF_6$, $Cl_2$, HCl, HBr and any mixtures thereof. For instance, the halogen-containing gas may be selected to be $NF_3$.

In some embodiments of the method described above, the carbon-containing gas is selected from the group consisting of CO and $CH_4$, and any mixtures thereof. For instance, the carbon-containing gas may be selected to be $CH_4$.

In some embodiments of the method described above, the second semiconductor material comprises at least partially the first semiconductor material. For instance, the second semiconductor material may be similar or substantially identical to the first semiconductor material. Alternatively, the second and the first semiconductor material may be different materials.

According to another aspect, the method described above may be used for the manufacture of a semiconducting device, such as an MEMS device.

According to yet another aspect, the method described above may be used for the manufacture of semiconducting devices features, such as for the manufacture of interconnections.

BRIEF DESCRIPTION OF THE DRAWINGS

All figures and drawings are intended to illustrate some aspects and embodiments of the present invention. The devices are depicted in a simplified way for reason of clarity. Not all alternatives and options are shown and therefore the invention is not limited to the content of the given drawings.

As shown in FIG. 1D, even after 1760 seconds of deposition, the nucleation layer has still not fully formed on the HDP oxide surface.

As shown in FIG. 2, after 1760 seconds of deposition 700 nm of CVD SiGe material has deposited on SiGe-comprising substrate material, whereas only 100 nm has deposited on HDP oxide-comprising substrate material.

DETAILED DESCRIPTION

Figure 1A:
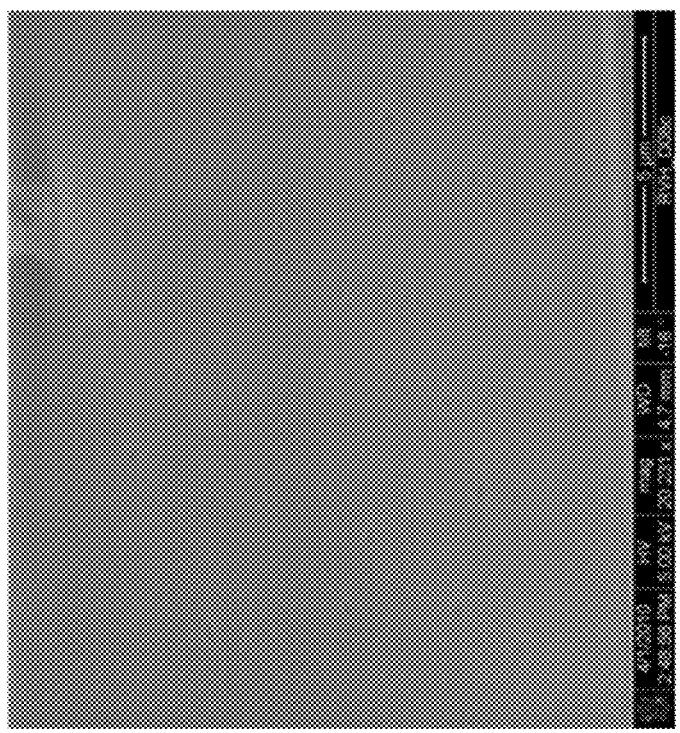
FIG. 1A-1D show cross-sectional scanning electron microscope images illustrating the gradual formation of the CVD SiGe nucleation layer after from 860 s (1A), 1160 s (1B), 1460 s (1C) to 1760 s (1D) of deposition on a high density plasma (HDP) oxide surface that had been pre-treated with a plasma produced from gaseous $CF_4$.
Figure 1B:
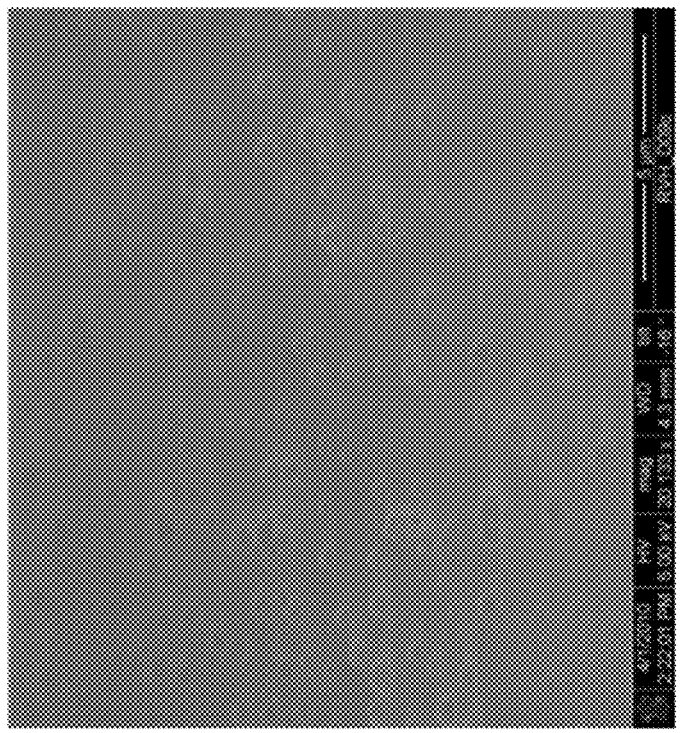

Chemical vapor deposition (CVD) is known to have no or very limited selectivity of deposition with respect to the nature (e.g., material, composition) of the substrate on which it is being deposited.

Plasma enhanced chemical vapor deposition (PECVD) is known to be a directional deposition technique (typically having a higher deposition rate on the horizontal than on the vertical surfaces). Like CVD, however, this technique is not selective with respect to the nature of the substrate exposed.

Accordingly, a material deposited using CVD or PECVD will be deposited everywhere on the substrate, irrespective of the nature of the exposed substrate. For example, in case gap filling is performed, a filling material will be deposited not only into the gap (e.g., trench, via, or hole) but also on top of the substrate. A subsequent polishing step, such as chemical mechanical polishing (CMP), would typically be needed to remove undesired deposited material and to have the surface planarized.

Despite some advancement in the art of selective deposition, no efficient method for the selective deposition of semiconductor material onto a mixed substrate comprising a semiconductor material and an insulator material has yet been described.

According to one aspect of the present invention, it is therefore provided a method for the (selective) deposition of a first semiconductor material on a substrate comprising a second semiconductor material and an insulator material, whereby the first semiconductor material is selectively deposited on the second semiconductor material, and wherein the method comprises the steps of:
  a) pre-treating the substrate with a plasma produced from a carbon- and/or halogen-containing gas; and
  b) depositing the first semiconductor material on the pre-treated substrate by chemical vapor deposition.

In the context of the present invention, the expression "plasma produced from a carbon- and/or halogen-containing gas" is not meant to refer to or describe the exact composition of the corresponding plasma, but merely to express that a suitable plasma (comprising all its component particles/elements) is generated or formed (or produced) from a suitable carbon- and/or halogen-containing gas feed using a suitable plasma-producing device.

It is well within the capabilities of the person skilled in the art to produce, without undue burden, a suitable plasma generated from a suitable carbon- and/or halogen-containing gas for use in the method of the present invention.

In the context of the present invention, the expression "carbon- and/or halogen-containing gas" is meant to refer to any one of a carbon-containing gas, a halogen-containing gas, and a carbon- and halogen-containing gas.

In the context of the present invention, it has been surprisingly found that when performing a pretreatment of a mixed substrate comprising a second semiconductor material and an insulator material with a plasma produced from a carbon- and/or halogen-containing gas, a first semiconductor material may be selectively deposited on the second semiconductor material. According to one aspect of the method, the first semiconductor material is exclusively deposited on the second semiconductor material without any deposition at all occurring (or remaining) on the insulator material of the substrate.

Further, it has been surprisingly discovered that while performing the method of the invention, up to 600 nm of SiGe may be deposited by CVD on a SiGe substrate, with substantially no SiGe deposition being observed on the insulating substrate (silicon oxide).

It is believed that the significant increase in the deposition selectivity is due to the incorporation/addition of carbon and/or halogen atoms/radicals (depending on the exact composition of the gas selected to produce the suitable plasma) on the surface of the substrate pre-treated with the plasma. It is further believed that the addition/incorporation of carbon and/or halogen atoms/radicals on the surface of the substrate causes a delay in the formation of the nucleation layer which in turn will detrimentally impact the semiconductor material deposition. However, these explanations are merely instructive and are not intended to be limiting; other explanations are possible as well.

In the context of the present invention, it has been surprisingly discovered that the delay in the formation of the nucleation layer is dramatically more pronounced for the insulating material than for the (second) semiconductor material, which in turn might explain the improved deposition selectivity obtained when performing the disclosed method. The improved deposition selectivity is believed to be due to the much prolonged incubation time needed to fully form a nucleation layer (of the first semiconductor material) on the surface of the insulating material when compared to that needed to fully form a nucleation layer (of the first semiconductor material) on the surface of the (second) semiconductor material. Again, however, this explanations is merely instructive and is not intended to be limiting; other explanations are possible as well.

Figure 1D:
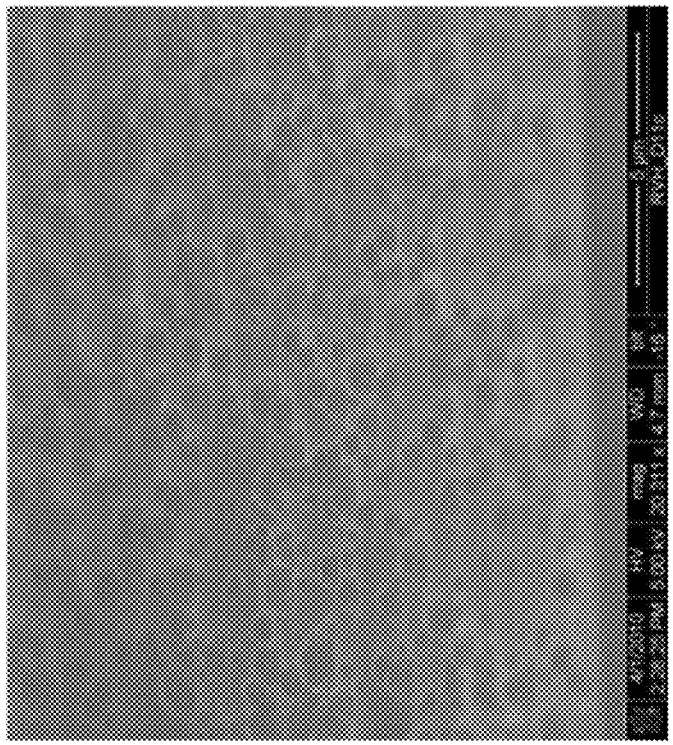
Figure 1C:
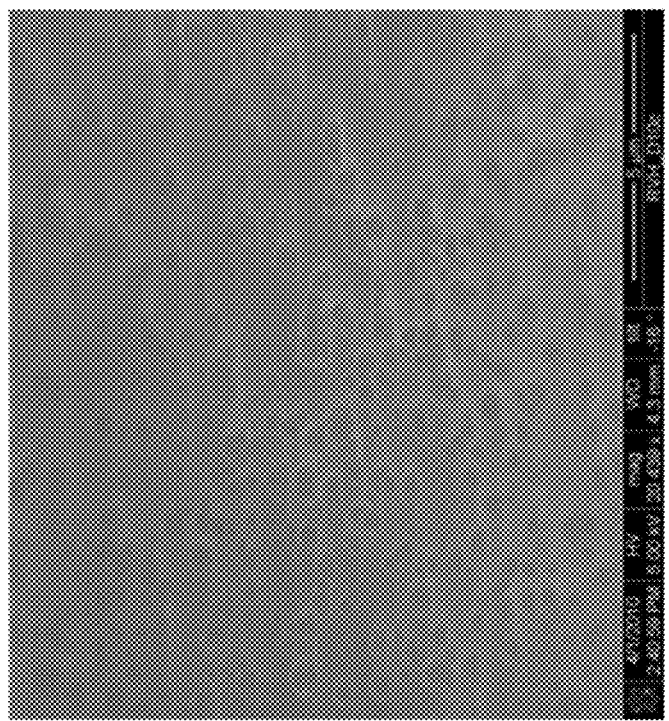

This surprising effect is shown in FIG. 1A-D, which illustrate the gradual formation of the CVD SiGe nucleation layer after from 860 to 1760 seconds of deposition on an HDP oxide surface that had been pre-treated with a plasma produced from gaseous $CF_4$. As shown in FIG. 1D, it can be seen that even after 1760 seconds of deposition, the nucleation layer has still not fully formed on the HDP oxide surface.

Figure 2:
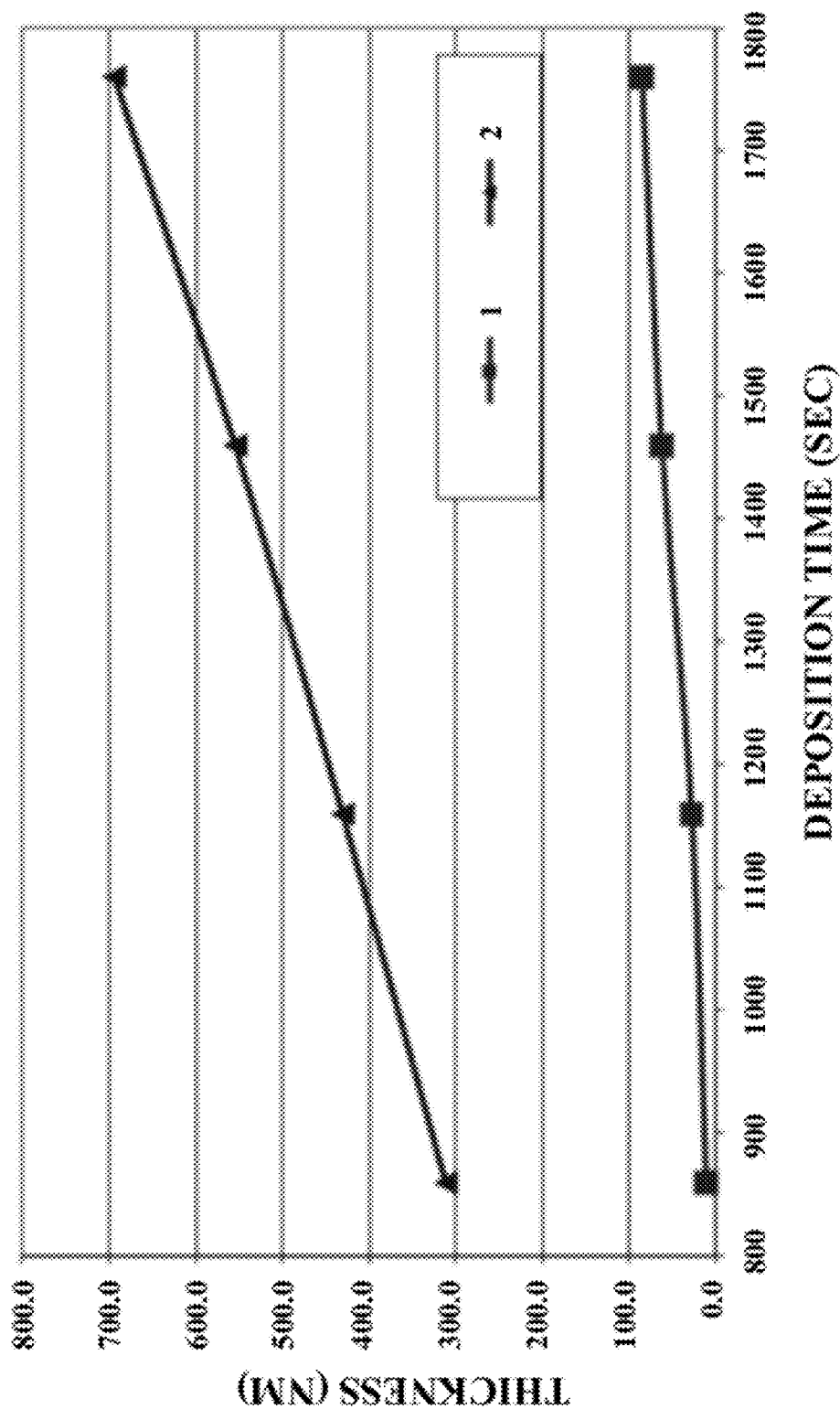
FIG. 2 is a graphical representation illustrating the deposition selectivity of CVD SiGe material on SiGe-comprising substrate material (curve 2) and on an HDP oxide-comprising substrate material (curve 1) when the substrate has been pre-treated with a plasma produced from $CF_4$.

Thus, Applicant has surprisingly discovered that applying a $CF_4$ plasma pre-treatment before the deposition of CVD SiGe significantly increases the incubation time of the SiGe deposition on oxide material from about 150 seconds to over 1760 seconds, knowing that the incubation time corresponds to the time needed to fully form a nucleation layer on the surface of oxide. Once the nucleation layer is formed the actual SiGe deposition may begin. During the incubation time, a layer of about 700 nm of CVD SiGe material may be deposited on SiGe layer, as shown in FIG. 2.

The disclosed method may find particular use in various integrated circuit manufacturing applications. In particular, the method may surprisingly be used for providing efficient trench narrowing, without requiring expensive photolithography techniques or high aspect ratio etching techniques, as further described below in connection with FIG. 3, and for efficient gap (trench or via) filling without requiring the use of CMP processing, as further described below in connection with FIG. 4.

Figure 3:
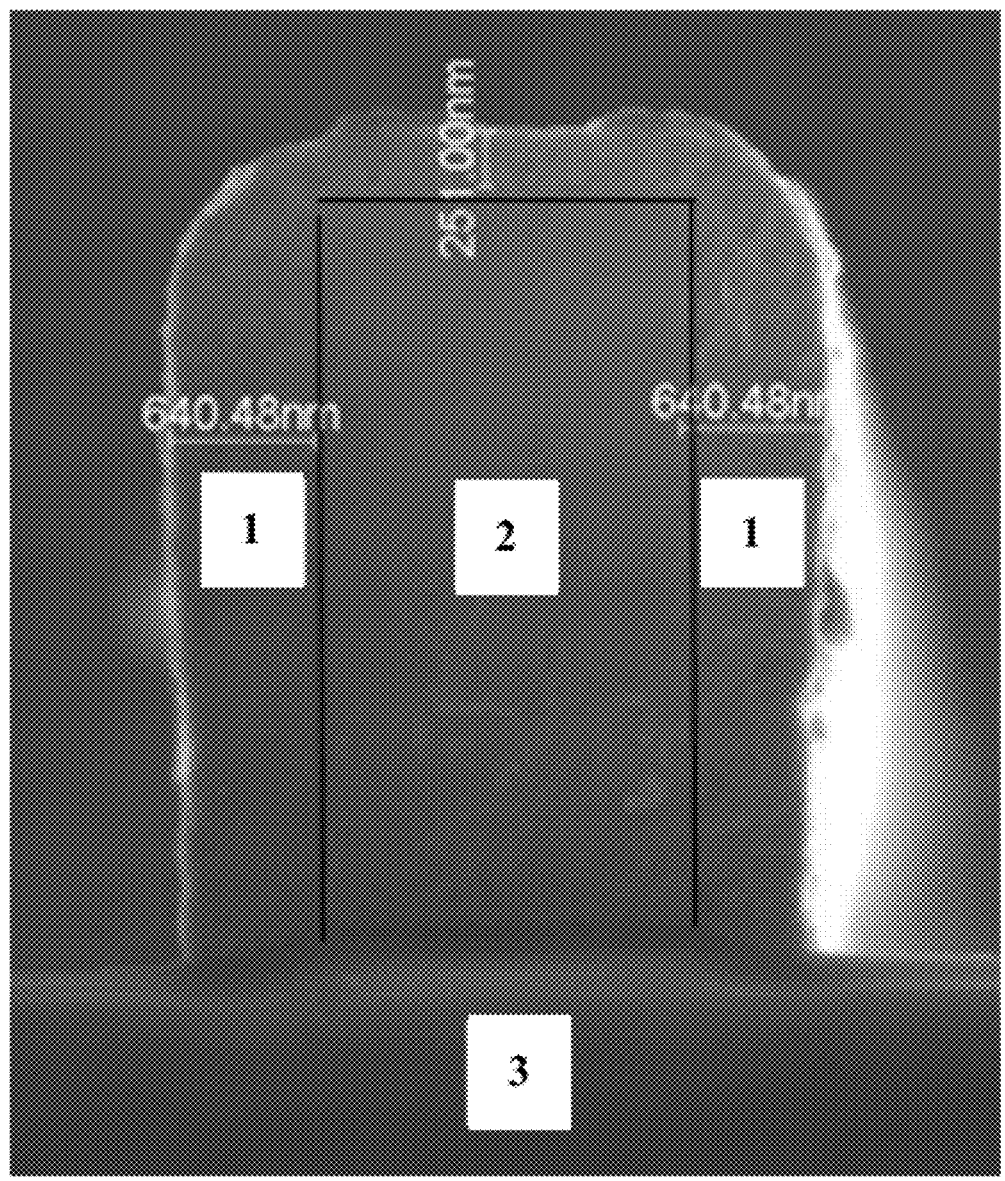
FIG. 3 is a cross-sectional SEM image illustrating the comparative evolution of the CVD deposition of SiGe material (1) in a substrate feature (protrusion/line) comprising SiGe (2) when compared to the CVD deposition of SiGe material on a substrate comprising HDP silicon oxide (3) while performing one embodiment of the disclosed method.

FIG. 3 illustrates the comparative evolution of the CVD deposition of SiGe material (1) in a substrate feature (protrusion/line) comprising SiGe (2) when compared to the CVD deposition of SiGe material on a substrate comprising HDP silicon oxide (3), in accordance with an embodiment of the disclosed method in which the substrate is pre-treated with a plasma produced from gaseous $CF_4$. FIG. 3 clearly shows that CVD SiGe material (1) is almost exclusively deposited on the exposed SiGe surfaces (2), whereas almost no CVD SiGe deposition occurred on the exposed oxide surfaces (3).

Figure 4:
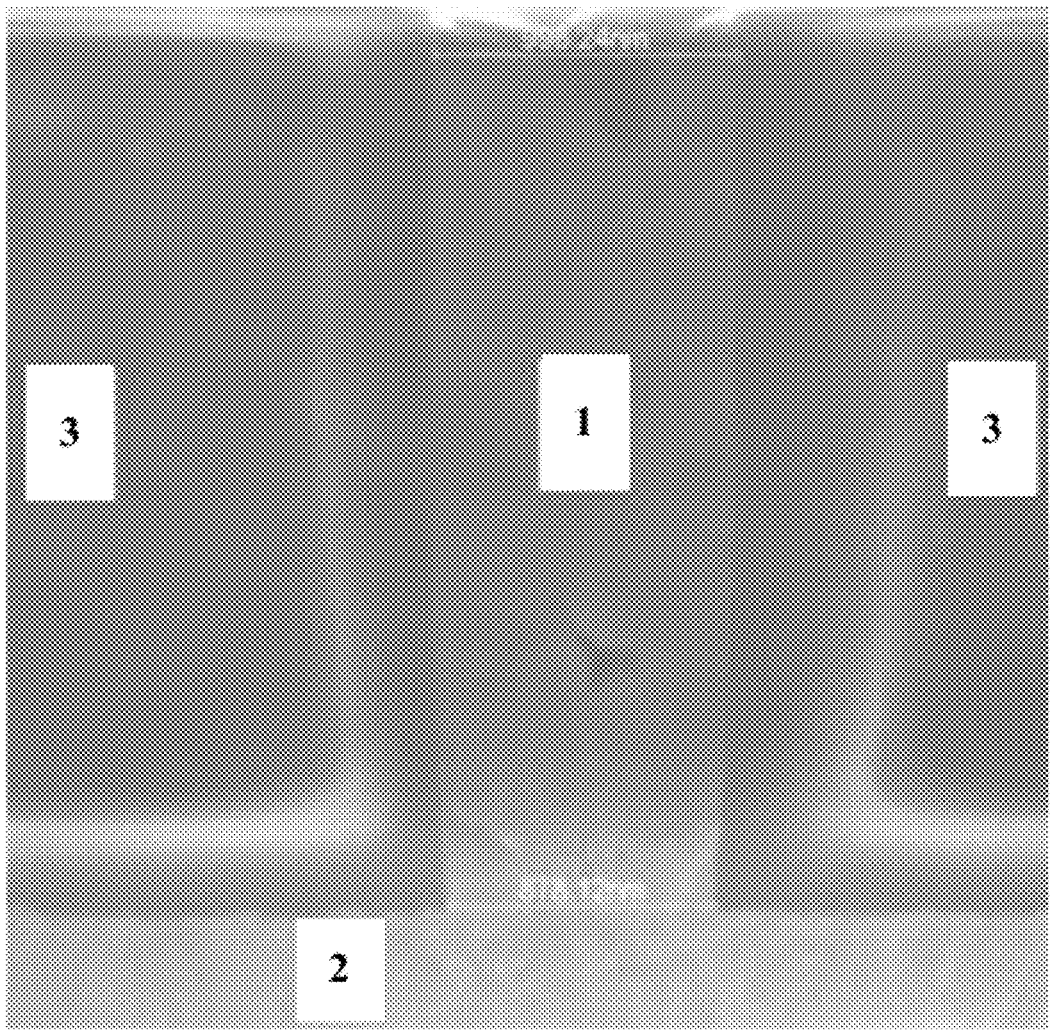
FIG. 4 is a cross-sectional SEM image illustrating SiGe CVD deposition (1) in a trench formed in a substrate comprising an HDP silicon oxide layer (3) and a SiGe layer (2), wherein the trench is formed through the HDP oxide layer and wherein the SiGe layer (2) is exposed at the bottom of the trench.

FIG. 4 illustrates the use of the method of the invention for trench filling. In particular, FIG. 4 shows SiGe CVD deposition (1) in a trench formed in a substrate comprising an HDP silicon oxide layer (3) and a SiGe layer (2), where the trench is formed through the HDP oxide layer (3) and the SiGe layer (2) is exposed at the bottom of the trench.

The example via (trench) illustrated in FIG. 4 is provided with a depth of about 3 microns and a width of about 1 micron. This trench-type is generally referred to as deep trench, which is typically encountered in MEMS manufacturing flows.

In one embodiment of the disclosed method, the substrate is provided with a trench or a via formed in a layer comprising the insulator material, where the second semiconductor material is at least partially exposed at the bottom of the trench or a via, and the trench or via is at least partially filled with the first semiconductor material. In some embodiments, the trench or via is completely filled with the first semiconductor material.

Alternatively, in another embodiment of the disclosed method, the substrate is provided with a trench or a via formed in a layer comprising the second semiconductor material, wherein the insulator material is at least partially exposed at the bottom of the trench or a via, and whereby the trench or via is at least partially narrowed with the first semiconductor material.

According to another aspect, a method of forming a semiconducting device feature is disclosed, wherein the method comprises the steps of:
 a) providing a substrate comprising a second semiconductor material and an insulator material, wherein the substrate is provided with a trench or a via formed in a layer comprising the insulator material and wherein the second semiconducting material is at least partially exposed at the bottom of the trench or via;
 b) pre-treating the substrate with a plasma produced from a carbon- and/or halogen-containing gas; and
 c) depositing a first semiconductor material into the trench or via, thereby filling at least partially the trench or via.

In some embodiments of the method, the trench or via is completely filled with the first semiconductor material.

According to still another aspect, a method of forming a semiconducting device feature is disclosed, wherein the method comprises the steps of:
 a) providing a substrate comprising a second semiconductor material and an insulating material, wherein the substrate is provided with a trench or a via formed in a layer comprising the second semiconductor material, and wherein the insulating material is at least partially exposed at the bottom of the trench or the via;
 b) pre-treating the substrate with a plasma produced from a carbon- and/or halogen-containing gas; and
 c) depositing a first semiconductor material onto the layer comprising the second semiconductor material, preferably onto the sidewalls of the trench or via, thereby narrowing at least partially the trench or via.

In some embodiments, the semiconducting device feature is an interconnection.

In some embodiments, the step of depositing the first semiconductor material on the pre-treated substrate is performed immediately after the step of pre-treating the substrate with a plasma produced from a carbon- and/or halogen-containing gas. In the context of the present disclosure, the expression "immediately after" may be understood to reflect that no other additional processing steps are performed in between the two corresponding processing steps.

In some embodiments, the step of pre-treating the substrate is performed with a plasma produced from a carbon- and halogen-containing gas. In other embodiments, the step of pre-treating the substrate is performed with a plasma produced from a halogen-containing gas. In still other embodiments, the step of pre-treating the substrate is performed with a plasma produced from a carbon-containing gas.

In some embodiments, the step of pre-treating the substrate is performed with a plasma produced from a carbon- and/or fluorine-containing gas. In some embodiments, the plasma is produced from a carbon- and fluorine-containing gas.

In some embodiments, the step of pre-treating the substrate with a plasma produced from a carbon- and/or halogen-containing gas, and the step of depositing the first semiconductor material on the pre-treated substrate by chemical vapor deposition, are reiterated (repeated) one or more times, such as any of 2, 3, 4, 5, 6, 7, 8, 9 or 10 times.

More specifically, in some embodiments the plasma pre-treatment (with e.g. a plasma produced from gaseous $CF_4$) may be repeated before the nucleation layer is fully formed on the insulating material (e.g. silicon oxide) so as to remove the nucleation layer which may have potentially formed on the insulating material and recondition the surface with C and/or halogen atoms/radicals, and the deposition may be resumed.

The sequence of pre-treating the substrate with a plasma produced from a carbon- and/or halogen-containing gas (e.g., gaseous $CF_4$) and depositing the first semiconductor material (e.g., SiGe) on the pre-treated substrate by CVD, may be repeated as many times as required until the final desired thickness of first semiconductor material is obtained on the second semiconductor material (e.g. SiGe).

Once the desired final thickness is achieved, a final pre-treatment may optionally be performed so as to remove the partial nucleation layer that may have formed on the insulating material surface. This final pre-treatment may be particularly desirable when a plasma produced from carbon-containing gas is used. In one embodiment, the final pre-treatment may be a final pre-treatment with a plasma produced from a halogen-containing gas.

In the context of filling (deep) trenches or vias (typically having a depth and a width of one or several microns), the repetition (re-iteration) of the sequence of pre-treating the substrate with a plasma produced from a carbon- and/or halogen-containing gas and depositing the first semiconductor material on the pre-treated substrate by chemical vapor deposition, may eliminate the need of using CMP processing, which is typically used after deep-trench fill with conventional non-selective deposition techniques.

Figure 5:
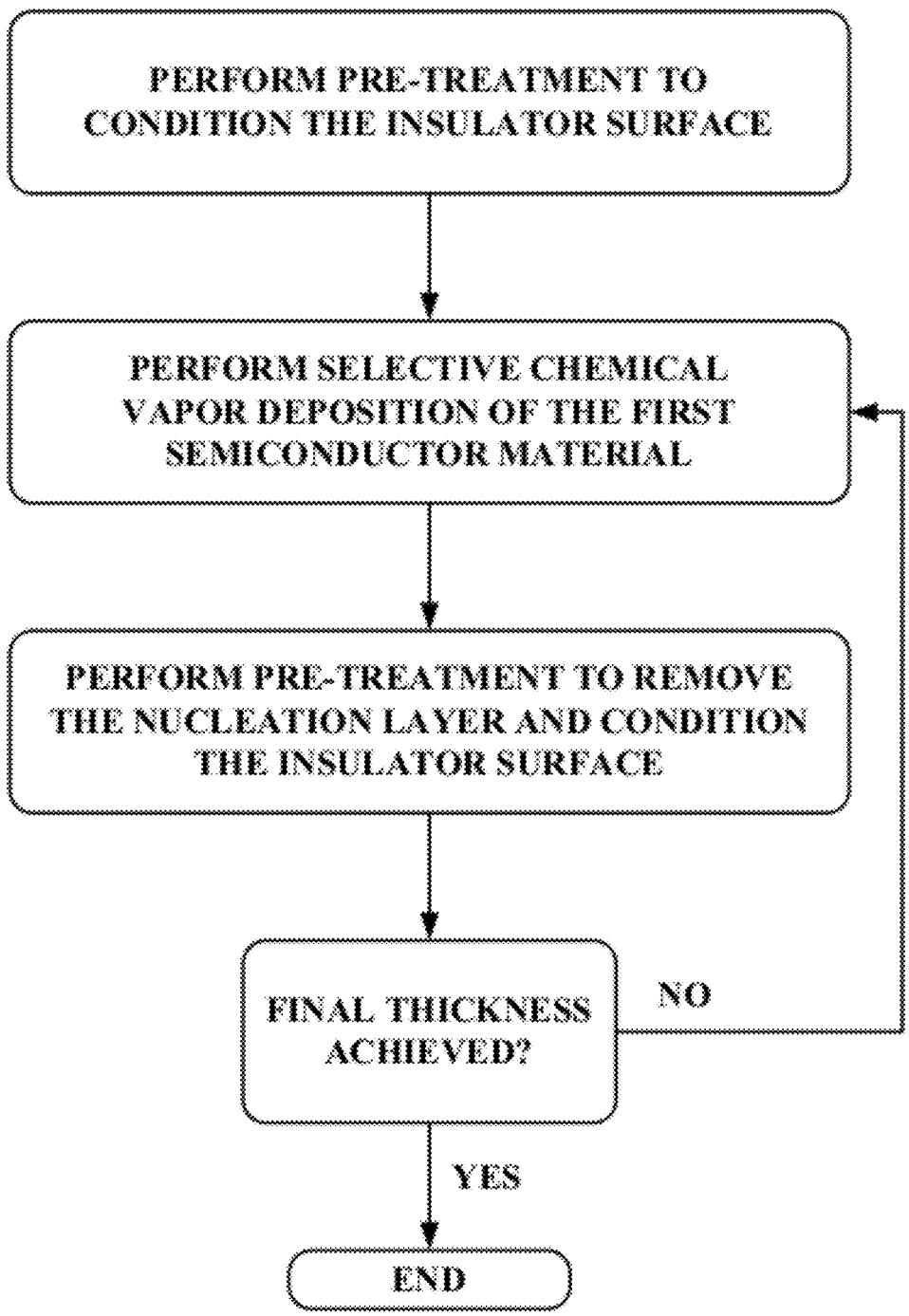
FIG. 5 shows a flow chart schematically describing the sequence of the process steps of the disclosed method, in accordance with an embodiment.

FIG. 5 shows a flow chart schematically describing the sequence of the process steps of the disclosed method, in accordance with an embodiment. More particularly, FIG. 5 illustrates the optional repetition of the sequence consisting of pre-treating the substrate with a plasma produced from a carbon- and/or halogen-containing gas and depositing the first semiconductor material on the pre-treated substrate by chemical vapor deposition.

In some embodiments, the step of pre-treating the substrate with a plasma produced from a carbon- and/or halogen-containing gas is performed in a plasma deposition chamber, preferably in-situ in the same plasma deposition chamber as that used subsequently for depositing the first semiconductor material on the pre-treated substrate by CVD.

In particular, in some embodiments the step of pre-treating the substrate with a plasma produced from a carbon- and/or halogen-containing gas is performed in a PECVD chamber. Alternatively, the step of pre-treating the substrate with a plasma produced from a carbon- and/or halogen-containing gas is performed in a radio frequency (RF) plasma etch chamber. Alternatively still, the step of pre-treating the substrate with a plasma produced from a carbon- and/or halogen-containing gas is performed in a plasma chamber or in plasma-forming device which is different (distinct) from that used for depositing the first semiconductor material on the pre-treated substrate by CVD.

In some embodiments, the duration of the step consisting of pre-treating the substrate with a plasma produced from a carbon- and/or halogen-containing gas is comprised between 0.5 second and 300 seconds, preferably between 1 second and 200 seconds, more preferably between 2 seconds and 100 seconds, even more preferably between 3 seconds and 50 seconds, most preferably between 4 seconds and 30 seconds.

In embodiments where the method involves repeating the sequence of pre-treating the substrate with a plasma produced from a carbon- and/or halogen-containing gas and depositing the first semiconductor material on the pre-treated substrate by chemical vapor deposition, the duration of the initial (i.e., the very first) pre-treatment (before any deposition is done) may be shorter than the subsequent pre-treating sequences. This might be explained by the fact that the subsequent pre-treating sequences mostly and first etch (remove) the nucleation layer that has potentially formed on the insulator material. It is to be understood that this explanation is merely instructive and is not meant to be limiting; other explanations are possible as well. The subsequent pre-treatment times may be any of 2, 3, 5, or up to 10 times longer than the initial pre-treating time. The subsequent pre-treating times may also be optimized as a function of the pursued application: gap fill or trench narrowing, which is well within the practice of the skilled person.

In one embodiment, the step of pre-treating the substrate with a plasma produced from a carbon- and/or halogen-containing gas is performed by supplying a carbon- and/or halogen-containing gas flow comprised between 10 sccm and 2000 sccm, preferably between 50 sccm and 1000 sccm, more preferably between 100 sccm and 600 sccm, even more preferably between 150 sccm and 300 sccm, most preferably between 150 sccm and 250 sccm.

In some embodiments, the first semiconductor material is selected from the group consisting of silicon, germanium, SiGe, silicon carbide and any combinations thereof. For instance, the first semiconductor material may comprise SiGe, wherein SiGe may be characterized by the general formula: $Si_xGe_{1-x}$ with $0<x<1$. Most preferably, the first semiconductor material consists of SiGe.

In some embodiments, the insulator material is selected from the group consisting of silicon oxide, silicon nitride, silicon oxinitrides (SION), and any combinations thereof. For instance, the insulator material may comprise or may consist of silicon oxide.

In some embodiments, the carbon- and/or halogen-containing gas is selected from the group consisting of $CF_4$, $C_2F_6$, $NF_3$, $COF_2$, $SiF_4$, $SF_6$, $Cl_2$, HCl, HBr, CO, $CH_4$, $CHF_3$, $CHCl_3$, $CFCl_3$, $CF_3Cl$, $CF_3Br$ and any combinations or mixtures thereof. For instance, the carbon- and/or halogen-containing gas may be selected from the group consisting of $CF_4$, $C_2F_6$, $COF_2$, $CHF_3$ and any combinations or mixtures thereof. In one embodiment, the carbon- and/or halogen-containing gas may comprise or may consist of $CF_4$.

In some embodiments, the halogen-containing gas is selected from the group consisting of $NF_3$, $SiF_4$, $SF_6$, $Cl_2$, HCl, HBr and any combinations or mixtures thereof. For instance, the fluorine-containing gas may be selected to be $NF_3$.

In some embodiments, the carbon-containing gas is selected from the group consisting of CO and $CH_4$, and any combinations or mixtures thereof. For instance, the carbon-containing gas may be selected to be $CH_4$.

In some embodiments, the second semiconductor material comprises at least partially the first semiconductor material. For instance, the second semiconductor material may be similar or substantially identical to the first semiconductor material. In other embodiments, the second and the first semiconductor material are different materials. In still other embodiments, the second and the first semiconductor material comprise the same material but with different composition (e.g., with different Si/Ge ratios).

The disclosed method may allow substantially full selectivity of deposition, such that substantially no deposition of the first semiconductor material is obtained on the insulator material. Such substantially full selectivity may be achieved when the nucleation layer, which has potentially formed on the insulator material, is each time removed by a suitable plasma pre-treatment. Alternatively, the substantially full selectivity may be achieved when the nucleation layer is removed once at the end of the sequence consisting of repeating the cycle consisting of pre-treating the substrate with a plasma produced from a carbon- and/or halogen-containing gas and depositing the first semiconductor material on the pre-treated substrate by chemical vapor deposition.

In some embodiments, the selectivity for the formation of the nucleation layer of the first semiconductor material on the second material over the insulator material may be above 100:1, above 200:1, above 300:1, above 400:1, above 500:1, or even above 600:1.

Typically, the higher the selectivity for the formation of the nucleation layer of the first semiconductor material on the second semiconductor material over the insulator material, the longer the deposition may be performed on the semiconductor material and the fewer pre-treatments will be needed.

It has been further discovered that that the deposition selectivity of the first semiconductor material on the second semiconductor material over the insulator material may not be increased or decreased by altering the amount of carbon- and/or halogen-containing gas (e.g. $CF_4$), the amount of RF power, or the duration of the plasma pre-treatment (within the limits mentioned elsewhere in the disclosure). This in turn suggests that the amount of C and/or halogen atoms/radicals on the insulator substrate required for maximum deposition selectivity to be achieved is obtained during the initial phase of the pre-treatment with the plasma produced from the carbon- and/or halogen-containing gas. After this initial phase, it is believed that the rate of carbon and/or halogen incorporation is limited by the rate of oxide removal. It is to be understood that this explanation is merely instructive and is not meant to be limiting; other explanations are possible as well.

Accordingly, it is believed the method according to the invention is advantageously not dependent upon the amount of carbon- and/or halogen-containing gas, the amount of RF power, or the duration of the plasma pre-treatment.

However, where a sequence including multiple plasma pre-treatment/deposition cycles is performed to achieve a desired thickness, the plasma pre-treatment (e.g., with a plasma produced from gaseous $CF_4$) time after each deposition may be long enough to remove the nucleation layer potentially formed during the previous deposition step. Typically, the first plasma pre-treatment is preferably very short, just enough to pre-condition the insulator surface, while the subsequent plasma pre-treatments are any of 2, 3, 5 or even 10 times longer than the first plasma pre-treatment and thus long enough to remove the nucleation layer.

In some embodiments, the method may be used for the manufacture of a semiconducting device, such as a MEMS device. In other embodiments, the method may be used for the manufacture of semiconducting devices features, such as for the manufacture of interconnections.

EXAMPLES

Example 1

Trench Narrowing

In this example, trenches with a thickness (height) of 2 microns are defined in a layer of amorphous SiGe, exposing silicon oxide at the bottom (as represented in FIG. 3).

The following sequence/protocol is run:

1) 40 s pre-treatment with a plasma produced from gaseous $CF_4$ so as to condition the oxide substrate, followed by 2) selective deposition by CVD of 400 nm SiGe on the walls and the top of the exposed SiGe trenches, followed by 3) 60 s pre-treatment with a plasma produced from gaseous $CF_4$ so as to remove the nucleation layer formed on the silicon oxide and condition the oxide substrate, followed by 4) repeating step (2)/step (3) sequence as many times as needed to achieve the desired trench width, while making sure the last step is a $CF_4$-pretreatment to remove the nucleation layer formed during the last deposition step on the silicon oxide.

The CVD SiGe process is performed with the following gas feed: 15 sccm $SiH_4$, 166 sccm $GeH_4$ and 10 sccm $B_2H_6$, while the deposition time is 870 s. During the pre-treatment step, a 560 sccm $CF_4$ gas flow is used and a RF generator power of 560 W. A chamber clean is performed at the end of the whole sequence.

As showed in FIG. 3, the SiGe trench is narrowed on both sides with about 640 nm of SiGe material.

Example 2

Gap Filling

Vias are defined in a layer of silicon oxide having a width of about 1 micron and a depth of about 3 microns, whereby SiGe is exposed at the bottom of the vias (as represented in FIG. 4).

The following sequence is run:

1) 30 s $CF_4$ pre-treatment with a plasma produced from gaseous $CF_4$ so as to condition the oxide top surface and sidewalls, followed by 2) selective deposition by CVD of 600 nm SiGe on the exposed SiGe at the bottom of the vias, followed by 3) 50 s pre-treatment with a plasma produced from gaseous $CF_4$ so as to remove the nucleation layer on the silicon oxide and condition the oxide surfaces exposed, followed by 4) repeating step (2)/step (3) sequence as many times as needed to fill the vias and, at the end, perform a 40 s pre-treatment with a plasma produced from gaseous $CF_4$ so as to remove the nucleation layer formed during the last deposition step on the silicon oxide.

The CVD SiGe process is performed with the following gas feed: 15 sccm $SiH_4$, 166 sccm $GeH_4$ and 10 sccm $B_2H_6$, while the deposition time is 1170 s. During the pre-treatment step, a 560 sccm $CF_4$ gas flow is used and an RF power of 560 W. A chamber clean is performed at the end of the whole sequence.

As showed in FIG. 4, the via formed in the silicon oxide layer is fully filled with SiGe material, without advantageously requiring CMP processing.

The invention claimed is:

1. A method comprising:
   providing a substrate comprising an insulating material and a second semiconductor material;
   pre-treating the substrate with a plasma produced from a gas selected from the group consisting of a carbon-containing gas, a halogen-containing gas, and a carbon-and-halogen containing gas to condition the insulating material;
   depositing a first semiconductor material on the pre-treated substrate by chemical vapor deposition, wherein the first semiconductor material is selectively deposited on the second semiconductor material; and
   repeating the steps of pre-treating the substrate and depositing the first semiconductor material at least one additional time, wherein a repeated step of pre-treating the substrate removes a nucleation layer formed on the insulating material.

2. The method of claim 1, wherein depositing the first semiconductor material comprises depositing the first semiconductor material immediately after pre-treating the substrate.

3. The method of claim 1, wherein the gas comprises one of a carbon-containing gas, a fluorine-containing gas, and a carbon-and-fluorine containing gas.

4. The method of claim 1, wherein the substrate comprises at least one of a trench and a via that (i) is formed in the insulator material, (ii) at least partially exposes the second semiconductor material, and (iii) is at least partially filled with the first semiconductor material.

5. The method of claim 4, wherein the at least one of a trench and a via has a depth and a width of at least one micron.

6. The method of claim 1, wherein the substrate comprises at least one of a trench and a via that (i) is formed in the second semiconductor material, (ii) at least partially exposes the insulator material, and (iii) is at least partially narrowed by the first semiconductor material.

7. The method of claim 1, wherein pre-treating the substrate comprises pre-treating the substrate in-situ in a plasma deposition chamber.

8. The method of claim 7, wherein the plasma deposition chamber comprises a plasma enhanced chemical vapor deposition chamber.

9. The method of claim 1, wherein pre-treating the substrate comprises pre-treating the substrate for a time in the range of 0.5 and 300 seconds.

10. The method of claim 1, wherein pre-treating the substrate comprises supplying the gas with a flow in the range of 10 and 2000 standard cubic centimeters per minute.

11. The method of claim 1, wherein the first semiconductor material is selected from the group consisting of silicon, germanium, silicon germanium, silicon carbide, and combinations thereof.

12. The method of claim 1, wherein the insulator material is selected from the group consisting of silicon oxide, silicon nitride and combination thereof.

13. The method of claim 1, wherein the gas is selected from the group consisting of $CF_4$, $C_2F_6$, $NF_3$, $COF_2$, $SiF_4$, $SF_6$, $Cl_2$, HCl, HBr, CO, $CH_4$, $CHF_3$, $CHCl_3$, $CFCl_3$, $CF_3Cl$, $CF_3Br$, and mixtures thereof.

14. The method of claim 1, wherein the gas comprises $CF_4$.

15. The method of claim 1, wherein the second semiconductor material comprises the first semiconductor material.

16. The method of claim 1, wherein the second semiconductor material is substantially the same as the first semiconductor material.

17. The method of claim 1, wherein the semiconducting device comprises a micro electromechanical system device.

18. The method of claim 1, wherein a duration of an initial step of pre-treating the substrate is shorter than a duration of the repeated step of pre-treating the substrate.

19. The method of claim 18, wherein the duration of the repeated step of pre-treating the substrate is at least two times longer than the duration of the initial step of pre-treating the substrate.

20. The method of claim 1, wherein at least 600 nm of the first semiconductor material is selectively deposited on the second semiconductor material.

21. A method of manufacturing a semiconducting device, comprising:

providing a substrate comprising an insulating material and a second semiconductor material;

pre-treating the substrate with a plasma produced from a gas selected from the group consisting of a carbon-containing gas, a halogen-containing gas, and a carbon-and-halogen containing gas to condition the insulating material;

depositing a first semiconductor material on the pre-treated substrate by chemical vapor deposition, wherein the first semiconductor material is selectively deposited on the second semiconductor material; and repeating the steps of pre-treating the substrate and depositing the first semiconductor material at least one additional time, wherein a repeated step of pre-treating the substrate removes a nucleation layer formed on the insulating material, thereby forming a semiconducting device.

22. A method of manufacturing a semiconducting device feature, comprising:

providing a substrate comprising an insulating material and a second semiconductor material;

pre-treating the substrate with a plasma produced from a gas selected from the group consisting of a carbon-containing gas, a halogen-containing gas, and a carbon-and-halogen containing gas to condition the insulating material;

depositing a first semiconductor material on the pre-treated substrate by chemical vapor deposition, wherein the first semiconductor material is selectively deposited on the second semiconductor material; and repeating the steps of pre-treating the substrate and depositing the first semiconductor material at least one additional time, wherein a repeated step of pre-treating the substrate removes a nucleation layer formed on the insulating material, thereby forming a semiconducting device feature.

23. The method of claim 22, wherein the feature comprises an interconnect.

* * * * *